US 9,746,627 B2

(12) United States Patent
Ishige et al.

(10) Patent No.: US 9,746,627 B2
(45) Date of Patent: Aug. 29, 2017

(54) SEMICONDUCTOR LASER MODULE

(71) Applicant: FURUKAWA ELECTRIC CO., LTD., Tokyo (JP)

(72) Inventors: Yuta Ishige, Tokyo (JP); Naoki Hayamizu, Tokyo (JP); Etsuji Katayama, Tokyo (JP); Toshio Kimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/062,744

(22) Filed: Mar. 7, 2016

(65) Prior Publication Data

US 2016/0246022 A1 Aug. 25, 2016

Related U.S. Application Data

(63) Continuation of application No. PCT/JP2014/074306, filed on Sep. 12, 2014.
(Continued)

(30) Foreign Application Priority Data

Feb. 14, 2014 (JP) .................... 2014-026241

(51) Int. Cl.
G02B 6/42 (2006.01)
H01S 5/40 (2006.01)
(Continued)

(52) U.S. Cl.
CPC ......... G02B 6/4296 (2013.01); G02B 6/4206 (2013.01); H01S 5/02252 (2013.01);
(Continued)

(58) Field of Classification Search
CPC ............... G02B 6/4296; H01S 5/02469; H01S 5/02284; H01S 5/02252; H01S 5/4012; H01S 5/02216; H01S 5/0071
See application file for complete search history.

(56) References Cited

U.S. PATENT DOCUMENTS 4,678,273 A 7/1987 Vilhelmsson
4,762,385 A 8/1988 Fuse
(Continued)

FOREIGN PATENT DOCUMENTS

CN 202210172 U 5/2012
DE 43 05 313 C1 3/1994
(Continued)

OTHER PUBLICATIONS

International Search report issued Dec. 9, 2014 in PCT/JP2014/074306, filed on Sep. 12, 2014 ( with English translation).
(Continued)

Primary Examiner — Dung Nguyen
(74) Attorney, Agent, or Firm — Oblon, McClelland, Maier & Neustadt, L.L.P.

(57) ABSTRACT

A semiconductor laser module includes a semiconductor laser element outputting a laser light; an optical fiber; an optical component disposed at an outer periphery of the optical fiber and fixing the optical fiber; a first-fixing agent fastening the optical component and the optical fiber; a light-absorbing element disposed at an outer periphery of the optical component and fixing the optical component; a first light-blocking portion disposed between an end into which the laser light is incident of the optical fiber and the optical component; and a housing accommodating therein the semiconductor laser element, an end into which the laser light is incident of the optical fiber and the first light-blocking portion. The optical component has an optical transmittance at a wavelength of the laser light, and the light-absorbing
(Continued)

element has an optical absorptivity at a wavelength of the laser light.

21 Claims, 9 Drawing Sheets

Related U.S. Application Data

(60) Provisional application No. 61/877,069, filed on Sep. 12, 2013.

(51) Int. Cl.
    *H01S 5/00*       (2006.01)
    *H01S 5/022*     (2006.01)
    *H01S 5/024*     (2006.01)
    *G02B 6/26*      (2006.01)

(52) U.S. Cl.
    CPC ........ *H01S 5/02284* (2013.01); *H01S 5/4012* (2013.01); *G02B 6/262* (2013.01); *H01S 5/0071* (2013.01); *H01S 5/02216* (2013.01); *H01S 5/02469* (2013.01); *H01S 5/4043* (2013.01)

(56) References Cited

U.S. PATENT DOCUMENTS

| | | | |
|---|---|---|---|
| 5,619,602 A | 4/1997 | Sandstrom et al. | |
| 5,946,437 A | 8/1999 | Uchida et al. | |
| 2004/0008744 A1 | 1/2004 | Okazaki et al. | |
| 2005/0220163 A1* | 10/2005 | Okuta | G02B 6/02085 372/92 |
| 2009/0245315 A1 | 10/2009 | Faybishenko | |

FOREIGN PATENT DOCUMENTS

| | | |
|---|---|---|
| EP | 2 479 594 A1 | 7/2012 |
| JP | 60-158413 | 8/1985 |
| JP | 2-161406 A | 6/1990 |
| JP | 4-350603 A | 12/1992 |
| JP | 4-355705 A | 12/1992 |
| JP | 2003-107294 A | 4/2003 |
| JP | 2003-131079 | 5/2003 |
| JP | 2004-96088 | 3/2004 |
| JP | 2004-354771 | 12/2004 |
| JP | 2006-147879 A | 6/2006 |
| JP | 2007-258480 A | 10/2007 |
| JP | 2010-181574 | 8/2010 |
| JP | 2011-15519 A | 8/2011 |
| JP | 2013-161875 | 8/2013 |

OTHER PUBLICATIONS

Written Opinion issued Dec. 9, 2014 in PCT/JP2014/074306, filed Sep. 12, 2014.
Combined Chinese Office Action and Search Report issued Sep. 2, 2016 in Patent Application No. 201480049363.2 (with English language translation).
Office Action issued Jan. 4, 2017 in Japanese Patent Application No. 2016-073007 (with English language translation).
Extended European Search Report dated Apr. 7, 2017 in European Patent Application No. 14843557.1.

\* cited by examiner

_US 9,746,627 B2_

1

SEMICONDUCTOR LASER MODULE

CROSS-REFERENCE TO RELATED APPLICATION

This application is a continuation of PCT International Application No. PCT/JP2014/074306 filed on Sep. 12, 2014 which claims the benefit of priority from U.S. Provisional Patent Application No. 61/877,069 filed on Sep. 12, 2013 and Japanese Patent Application No. 2014-026241 filed on Feb. 14, 2014, the entire contents of which are incorporated herein by reference.

BACKGROUND OF THE INVENTION

1. Field of the Invention

The present invention relates to a semiconductor laser module.

2. Description of the Related Art

Conventionally, a method has been known, in a case where, in a semiconductor laser module, a laser light is output from an optical fiber, a laser light emitted from a semiconductor laser element fixed at a predetermined position on a package is condensed by a lens or the like to make the condensed laser light coupled to an optical fiber (for example, see Japanese Patent Application Laid-open Publication No. 2004-96088).

In such a light coupling method, if the semiconductor laser element is high in output, an adhesive fixing the optical fiber and a coated portion of the optical fiber are damaged by heat produced by optical absorption and reliability may decrease sometimes. For that reason, conventionally, a method of inserting an optical fiber through a transparent glass capillary to fix the optical fiber is known (for example, see Japanese Patent Application Laid-open Publication No. 2004-354771).

SUMMARY OF THE INVENTION

It is an object of the present invention to at least partially solve the problems in the conventional technology.

In accordance with one aspect of the present invention, a semiconductor laser module includes a semiconductor laser element outputting a laser light; an optical fiber including a core portion and a cladding portion formed at an outer periphery of the core portion, the laser light being made incident into an end of the optical fiber, the optical fiber guiding the laser light to outside the semiconductor laser module; an optical component being disposed at an outer periphery of the optical fiber and fixing the optical fiber; a first-fixing agent fastening the optical component and the optical fiber; a light-absorbing element being disposed at an outer periphery of the optical component and fixing the optical component; a first light-blocking portion disposed between an end, into which the laser light is incident, of the optical fiber and the optical component; and a housing accommodating therein the semiconductor laser element, an end, at a side into which the laser light is incident, of the optical fiber, and the first light-blocking portion. The optical component has an optical transmittance at a wavelength of the laser light, and the light-absorbing element has an optical absorptivity at a wavelength of the laser light.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
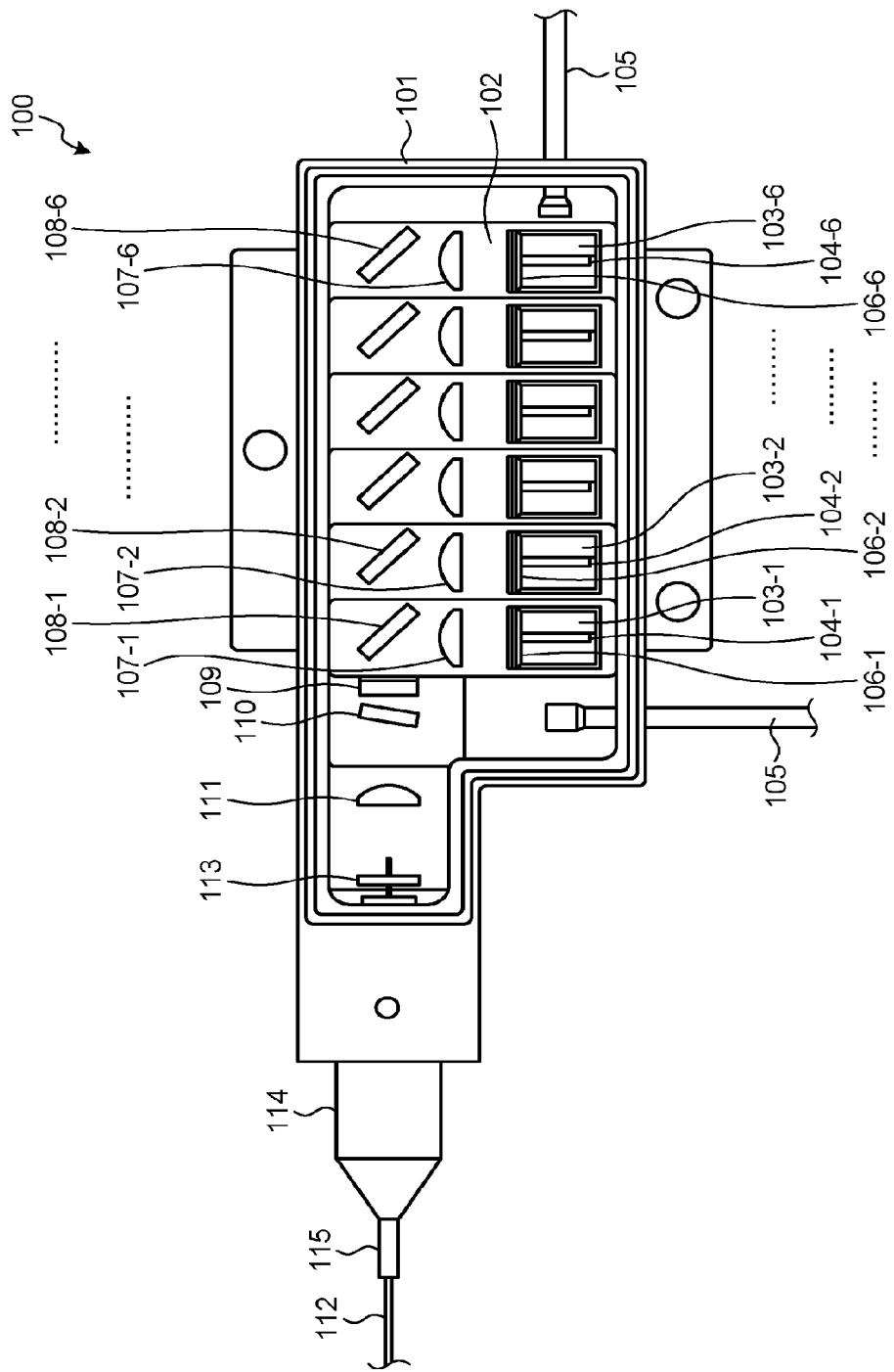
FIG. 1 is a schematic plan view of a semiconductor laser module according to an embodiment of the present invention.

Hereafter, embodiments of a semiconductor laser module according to the present invention will be explained in detail with reference to the drawings. The present invention is not limited to these embodiments. In all the drawings, identical or corresponding elements are given same reference numerals appropriately. Moreover, it should be noted that the drawings show schematic examples. Accordingly, a relationship between respective elements may be different from real values. Among the drawings, there may be parts where the relationships and ratios of the shown sizes are different from one another.

Inventors of the subject application found a problem that an adhesive and a coated portion may be damaged by produced heat even if a glass capillary is used in the semiconductor laser module.

In contrast, according to the embodiment described below, a highly reliable semiconductor laser module is achieved.

Figure 2:
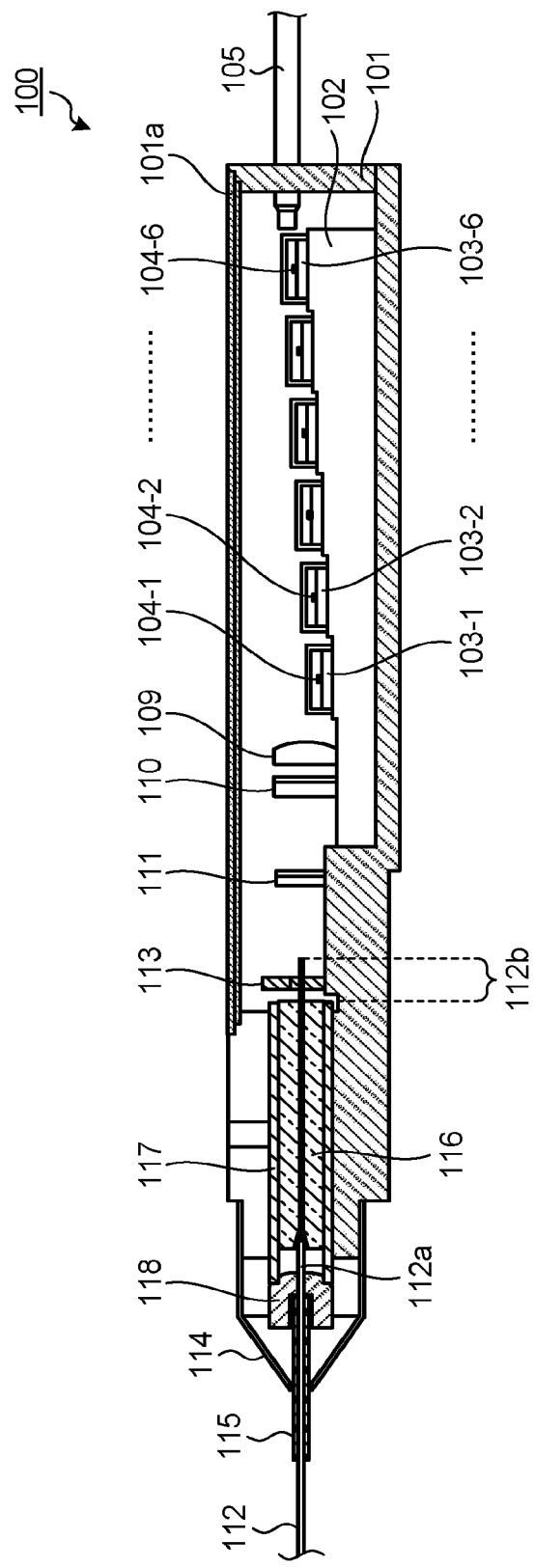
FIG. 2 is a schematic partially cutout view showing a side surface of the semiconductor laser module shown in FIG. 1.

To start with, a configuration of a semiconductor laser module according to an embodiment of the present invention will be explained. FIG. 1 is a schematic plan view of the semiconductor laser module according to the embodiment of the present invention. FIG. 2 is a schematic partially cutout view showing a side surface of the semiconductor laser module shown in FIG. 1. A semiconductor laser module 100 according to the present embodiment includes a package 101 as a housing, LD-height-adjusting plate 102, sub-mounts 103-1 to 6, and six semiconductor laser elements 104-1 to 6 mounted in order inside the package 101. Although the package 101 is provided with a lid 101a as shown in FIG. 2, the lid of the package 101 is omitted to be shown in FIG. 1. The semiconductor laser module 100 includes a lead pin 105 injecting a current to the semiconductor laser elements 104-1 to 6. The semiconductor laser module 100 includes first lenses 106-1 to 6, second lenses 107-1 to 6, mirrors 108-1 to 6, a third lens 109, an optical filter 110, and a fourth lens 111, as optical elements disposed in order on optical paths of laser lights outputted from the semiconductor laser elements 104-1 to 6. The first lenses 106-1 to 6, the second lenses 107-1 to 6, the mirrors 108-1 to 6, the third lens 109, the optical filter 110, and the fourth lens 111 are fixed inside the package 101 respectively. The semiconductor laser module 100 further includes an optical fiber 112 disposed to face the fourth lens 111. An end, at a side into which the laser light is incident, of the optical fiber 112 is enclosed inside the package 101.

As shown in FIG. 2, the semiconductor laser elements 104-1 to 6 are disposed on steps of the LD-height-adjusting plate 102 and inside the package 101. Each one of the first lenses 106-1 to 6, each one of the second lenses 107-1 to 6, and each one of the mirrors 108-1 to 6 are disposed at a corresponding height of each of the semiconductor laser elements.

A loose tube 115 is provided to an insertion portion, of the optical fiber 112, to be inserted into the package 101. A boot 114 is fitted outwardly on a portion of the package 101 to cover a portion of the loose tube 115 and the insertion portion.

As shown in FIG. 2, the optical fiber 112 is inserted into a glass capillary 116 as an optical component. The optical fiber 112 is provided with a coated portion 112a. However, the coated portion 112a is removed at a portion, being inserted into the glass capillary 116, of the optical fiber 112. The optical fiber 112 is provided with a protrusion portion 112b, at a portion at an incident side, projecting from the glass capillary 116. An outer periphery of the glass capillary 116 is covered with a light-absorbing element 117. The light-absorbing element 117 is fixed to the package 101. A second light-blocking portion 118 is disposed at a laser-light-emitting end side of the glass capillary 116. The second light-blocking portion 118 fits the light-absorbing element 117 at a laser-light-emitting end side of the light-absorbing element 117. The loose tube 115 is inserted through a portion of the second light-blocking portion 118.

Figure 3:
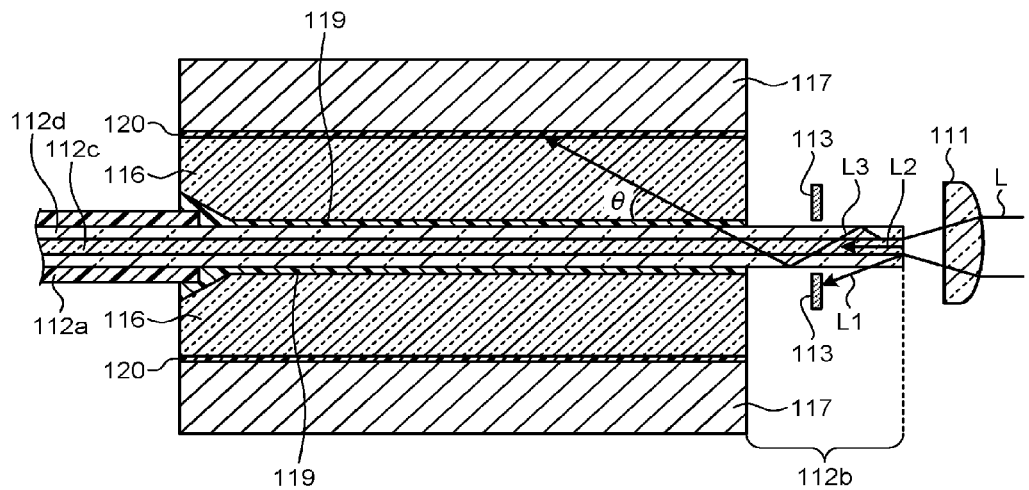
FIG. 3 is an enlarged schematic cross-sectional view of an optical fiber, a glass capillary, and a light-absorbing element of the semiconductor laser module shown in FIG. 1.

Hereafter, a configuration in the vicinity of the optical fiber 112 of the semiconductor laser module 100 will be explained in detail. FIG. 3 is an enlarged schematic cross-sectional view of the optical fiber, the glass capillary, and the light-absorbing element, of the semiconductor laser module shown in FIG. 1. As shown in FIG. 3, the optical fiber 112 includes a core portion 112c and a cladding portion 112d.

The optical fiber 112 is inserted through the glass capillary 116. The optical fiber 112 and the glass capillary 116 are fastened with a first-fixing agent 119. The glass capillary 116 is inserted through the light-absorbing element 117. The glass capillary 116 and the light-absorbing element 117 are fastened with a second-fixing agent 120.

A first light-blocking portion 113 is disposed between an end, into which the laser light is incident, of the optical fiber 112 and the glass capillary 116.

Hereafter, each of elements constituting the semiconductor laser module 100 shown in FIGS. 1 to 3 will be explained in further detail. It is preferable that the package 101 as a housing be made of a material of superior thermal conductivity for restraining an increase in temperature thereinside, and the package 101 may be made of a metal component made of various kinds of metal. It is preferable that, as shown in FIG. 2, a bottom surface of the package 101 be separated from a plane, on which the semiconductor laser module 100 is disposed, in an area in which the glass capillary 116 is disposed. Hereby, it is possible to decrease an influence of warp of the bottom surface of the package 101 when fixing the package 101 with a screw or the like.

As described above, the LD-height-adjusting plate 102 fixed in the package 101 is configured to adjust heights of the semiconductor laser elements 104-1 to 6 so that optical paths of the laser lights outputted by the semiconductor laser elements 104-1 to 6 do not interfere with each other. The LD-height-adjusting plate 102 may be configured to be united with the package 101.

The sub-mounts 103-1 to 6 are fixed on the LD-height-adjusting plate 102 to assist radiation of the semiconductor laser elements 104-1 to 6 mounted thereon. For that purpose, it is preferable that the sub-mounts 103-1 to 6 be made of a material of superior thermal conductivity, and the sub-mounts 103-1 to 6 may be metal components made of various kinds of metal.

The semiconductor laser elements 104-1 to 6 are high output semiconductor laser elements, of which optical power of the laser light being outputted is equal to or greater than 1 W, or equal to or greater than 10 W. In the present embodiment, the optical power of the laser light outputted from the semiconductor laser elements 104-1 to 6 is, for example, 11 W. The semiconductor laser elements 104-1 to 6 output, for example, laser lights at wavelengths of 900 nm to 1000 nm. The number of the semiconductor laser elements 104-1 to 6 may be more than one like the semiconductor laser module 100 according to the present embodiment. Alternatively, the number may be one and will not be limited specifically.

The lead pins 105 supplies electric power to the semiconductor laser elements 104-1 to 6 via a bonding wire not shown in the drawings. The electric power being supplied may be at a constant voltage or at a modulated voltage.

The first lenses 106-1 to 6 are cylindrical lenses, of which focal distances are, for example, 0.3 mm. Each one of the first lenses 106-1 to 6 is disposed at a position at which a light being outputted from each corresponding one of the semiconductor laser elements becomes an approximate collimated light in the vertical direction.

The second lenses 107-1 to 6 are cylindrical lenses of which focal distances are, for example, 5 mm. Each one of the second lenses 107-1 to 6 is disposed at a position at which a light being outputted from each corresponding one of the semiconductor laser elements becomes an approximate collimated light in the horizontal direction.

The mirrors 108-1 to 6 may be mirrors provided with various kinds of metal layers or dielectric layers, and it is preferable that reflectivities thereof be as high as possible at wavelengths of the laser lights being outputted from the semiconductor laser elements 104-1 to 6. The mirrors 108-1 to 6 are capable of fine-tuning a direction of the reflected laser light, of a corresponding one of the semiconductor laser elements, to be coupled to the optical fiber 112 desirably.

The third lens 109 and the fourth lens 111 are cylindrical lenses of which focal distances are, for example, 12 mm and 5 mm respectively and of which curvatures are orthogonal to each other. The third lens 109 and the fourth lens 111 condense the laser lights outputted by the semiconductor laser elements 104-1 to 6 to couple the condensed laser lights to the optical fiber 112 desirably. Positions of the third lens 109 and the fourth lens 111 relative to the optical fiber 112 are adjusted so that coupling efficiencies for the laser lights outputted by the semiconductor laser elements 104-1 to 6 to the optical fiber 112 are, for example, equal to or greater than 85%.

The optical filter 110 is a low-pass filter reflecting lights, for example, at wavelengths of 1060 nm to 1080 nm and transmitting lights at wavelengths of 900 nm to 1000 nm therethrough. As a result, the optical filter 110 makes the laser lights outputted by the semiconductor laser elements 104-1 to 6 be transmitted therethrough and prevents the light at wavelengths of 1060 nm to 1080 nm from being irradiated to the semiconductor laser elements 104-1 to 6 from outside. The optical filter 110 is disposed to be angled relative to the optical axis of the laser light so that the laser lights outputted by the semiconductor laser elements 104-1 to 6 and slightly reflected by the optical filter 110 do not return to the semiconductor laser elements 104-1 to 6.

The optical fiber 112 may be a multi-mode optical fiber of which core diameter is, for example, 105 μm and of which cladding diameter is, for example, 125 μm, or alternatively may be a single-mode optical fiber. For example, NA of the optical fiber 112 may be 0.15 to 0.22.

Figure 4:
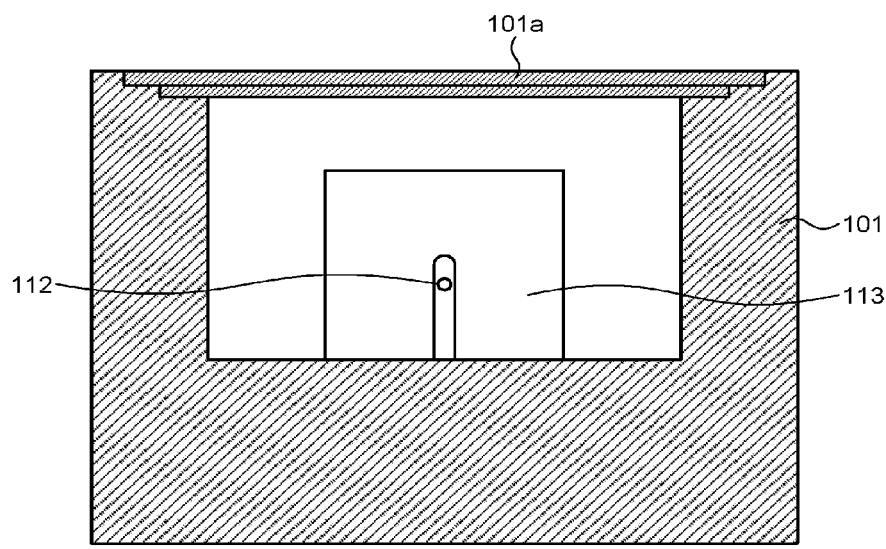
FIG. 4 is an enlarged schematic partially cutout view of a first light-blocking portion of the semiconductor laser module shown in FIG. 1.

The first light-blocking portion 113 is a rectangular plate component provided with a notched portion through which the protrusion portion 112b of the optical fiber 112 is inserted. An end of the optical fiber 112 is projecting from the first light-blocking portion 113. FIG. 4 is an enlarged schematic partially cutout view of the first light-blocking portion of the semiconductor laser module shown in FIG. 1. As shown in FIG. 4, the first light-blocking portion 113 is disposed at an outer periphery of the protrusion portion 112b of the optical fiber 112 and separated from the optical fiber 112.

By separating the first light-blocking portion 113 from the optical fiber 112, it is possible to restrain heat from being transferred from the first light-blocking portion 113 to the optical fiber 112, and thus, an increase in temperature of the first-fixing agent 119, which will be described later, can be restrained.

By providing the first light-blocking portion 113 so that the end of the optical fiber 112 projects from the first light-blocking portion 113 to an input side of the laser light, it is possible to restrain a non-coupled light from leaking from between the first light-blocking portion 113 and the optical fiber 112, and thus, it is possible to block the non-coupled light not being coupled to the optical fiber 112 more reliably.

The optical fiber 112 is inserted through the boot 114 preventing the optical fiber 112 being bent from damage. Although the boot 114 may be a boot made of metal, the material therefor may not be limited specifically, and the boot 114 may be made of rubber, various resin, plastics or the like.

The optical fiber 112 is inserted through the loose tube 115 preventing the optical fiber 112 being bent from damage. Moreover, the loose tube 115 being fastened to the optical fiber 112 may be configured, as a result, to prevent the optical fiber 112 from being shifted in position when a tensile force is applied to the optical fiber 112 in the longitudinal direction.

The glass capillary 116 is a round-tube-shaped glass capillary provided with a through hole. The optical fiber 112 is inserted through the through hole of the glass capillary 116. An inner wall of the through hole of the glass capillary 116 and the cladding portion 112d of the optical fiber 112 are fastened with the first-fixing agent 119. The glass capillary 116 has optical transmittance at wavelengths of laser lights outputted by the semiconductor laser elements 104-1 to 6, and it is preferable that the glass capillary 116 be made of, for example, material of which transmissivity is equal to or greater than 90% at these wavelengths. It is preferable that the refractive index of the glass capillary 116 be equal to or higher than the refractive index of the cladding portion 112d of the optical fiber 112. The relative refractive-index difference of the glass capillary 116 relative to the cladding portion 112d of the optical fiber 112 is, for example, equal to or higher than 0.1% and equal to or lower than 10%. The glass capillary 116 may be provided with a tapered portion, at a light-emitting side, for facilitating insertion of the optical fiber 112.

The light-absorbing element 117 is disposed at an outer periphery of the glass capillary 116 and is fastened to the glass capillary 116 with the second-fixing agent 120. The light-absorbing element 117 has optical absorptivity at wavelengths of the laser lights outputted by the semiconductor laser elements 104-1 to 6, and for example, its absorptivity is equal to or higher than 30%, or is more preferable to be equal to or greater than 70% at these wavelengths. As a result, the light-absorbing element 117 absorbs the laser light transmitted through the glass capillary 116. Since the light-absorbing element 117 radiates heat generated by optical absorption, it is preferable that the light-absorbing element 117 be made of a material, excellent in thermal conductivity, such as a metal component containing Cu, Ni, stainless steel, or Fe, a metal containing Ni, Cr, and Ti, or a member provided with a top-surface-plating layer containing C, ceramics component containing AlN or $Al_2O_3$, or a member provided with a ceramic layer covering a top surface containing AlN or $Al_2O_3$. It is preferable that the light-absorbing element 117 be connected to the package 101 via a good heat conductor, not shown in the drawings, since the light-absorbing element 117 radiates heat generated by optical absorption. It is preferable that the good heat conductor be made of material, for example, solder or thermally-conductive adhesive, of which thermal conductivity is equal to or greater than 0.5 W/mk.

The second light-blocking portion 118 is connected to the light-absorbing element 117, and moreover, the optical fiber 112 is inserted through the second light-blocking portion 118. As a result, the second light-blocking portion 118 prevents the light, transmitted through the glass capillary 116 and emitted from an end surface, at an emitting side, of the glass capillary 116, from being emitted to outside the semiconductor laser module 100. Therefore, it is preferable that the second light-blocking portion 118 be not damaged by the emitted light and be provided with, for example, such as a metal component containing Cu, Ni, stainless steel, or Fe, a member provided with a top-surface-plating layer containing Ni, Cr, Ti or the like, or a member provided with dielectric multi-layers. Moreover, it is preferable that a surface, at a side of the glass capillary 116, of the second light-blocking portion 118 be inclined or have a curvature so that a light incident thereto is reflected in a direction leaving away from the optical fiber 112.

The first-fixing agent 119, the second-fixing agent 120, other ultraviolet curable resin, and silicone or the like may be filled into a space surrounded by the second light-blocking portion 118, the light-absorbing element 117, and the glass capillary 116.

The first-fixing agent 119 and the second-fixing agent 120 may be made of a same material or may be made of different materials, and are made of, for example, epoxy resin, and ultraviolet curable resin such as urethane-based resin or the like. It is preferable that the refractive index of the first-fixing agent 119 be equal to or higher than the refractive index of the cladding portion 112d of the optical fiber 112 at 25° C., and it is more preferable that the refractive index of the first-fixing agent 119 be equal to or higher than the refractive index of the cladding portion 112d of the optical fiber 112 at a temperature range at which the semiconductor laser module 100 is being used (for example, 15° C. to 100° C.). It is preferable that the refractive index of the second-fixing agent 120 be equal to or higher than the refractive index of the glass capillary 116 at 25° C., and it is more preferable that the refractive index of the second-fixing agent 120 be equal to or higher than the refractive index of the glass capillary 116 at a temperature range at which the semiconductor laser module 100 is being used (for example, 15° C. to 100° C.). It may be configured that the refractive indices of the first-fixing agent 119 and the second-fixing agent 120 are approximately equal to the refractive index of the glass capillary 116 and higher than the refractive index of the cladding portion 112d of the optical fiber 112. In terms of the refractive indices of the first-fixing agent 119 and the second-fixing agent 120, relative refractive-index differences thereof relative to, for example, that of the glass capillary 116 are equal to or higher than 0% and equal to or lower than 10%. It is preferable that thicknesses of the first-fixing agent 119 and the second-fixing agent 120 in a plane that is orthogonal to the longitudinal direction of the optical fiber 112 be equal to or greater than 1 μm and equal to or less than 800 μm. It has been known that the refractive index of the ultraviolet curable resin can be lowered by making the ultraviolet curable resin contain fluorine and can be increased by making the ultraviolet curable resin contain sulfur, and thus, the refractive index thereof can be adjusted by adjusting amounts of refractive-index-increasing material and refractive-index-decreasing material.

Hereafter, an operation of the semiconductor laser module 100 according to the present embodiment will be explained. When electrical power is supplied from the lead pin 105, each of the semiconductor laser elements 104-1 to 6 disposed on the steps outputs a laser light. Each of the outputted laser light is made become an approximate collimated light by each of the first lenses 106-1 to 6 and each of the second lenses 107-1 to 6 respectively. Then, each of the laser lights are reflected in the direction of the optical fiber 112 by each of the mirrors 108-1 to 6 disposed at a corresponding height.

Then, each laser light is condensed by the third lens 109 and the fourth lens 111 to be coupled to the optical fiber 112. The laser light coupled to the optical fiber 112 is guided by the optical fiber 112 to be outputted to outside the semiconductor laser module 100. The semiconductor laser module 100 prevents unnecessary loss from being produced in the laser light by the steps of the semiconductor laser elements 104-1 to 6 and the mirrors 108-1 to 6. In the present embodiment, if optical powers of the lights outputted from the semiconductor laser elements 104-1 to 6 are 11 W respectively and coupling efficiencies are 85% respectively, an optical power of the light outputted from the semiconductor laser module 100 is 56 W.

Herein the way how the laser light condensed by the third lens 109 and the fourth lens 111 propagates will be explained in detail with reference to FIG. 3. For the purpose of simple description, in FIG. 3, description of refraction of the laser light L3 which will technically occur at an interface corresponding to a refractive index difference of respective members is omitted. The laser light L condensed by the third lens 109 and the fourth lens 111 becomes a non-coupled light L1 not being coupled to the optical fiber 112 and a light L2 being coupled to the optical fiber 112 and propagating in the optical fiber 112. Although almost of the light L2 coupled to the optical fiber 112 propagates in the core portion 112c of the optical fiber 112, guided and outputted to outside the semiconductor laser module 100, a part of the light L2 is coupled to the cladding portion 112d and becomes a light L3 propagating in the cladding portion 112d. Sometimes, a part of the light L2 propagating in the core portion 112c leaks from the core portion 112c to become a light L3 propagating in the cladding portion 112d.

The first light-blocking portion 113 restrains the non-coupled light L1 from being incident to the glass capillary 116, and absorbs a part of the non-coupled light L1. The heat produced by this optical absorption is radiated from the first light-blocking portion 113 to the package 101. For restraining the non-coupled light from being incident to the glass capillary 116 reliably, the first light-blocking portion 113 is disposed at the protrusion portion 112b of the optical fiber 112. For this purpose, it is preferable that the first light-blocking portion 113 be not damaged even if a part of the laser light is irradiated, and be provided with, for example, such as a metal component containing Cu, Ni, stainless steel, or Fe, a member provided with a top-surface-plating layer containing Ni, Cr, Ti or the like, or a member provided with dielectric multi-layers. For being separated from the optical fiber 112 reliably and blocking a light not coupled to the optical fiber 112 sufficiently, it is preferable that the first light-blocking portion 113 be set to have a distance (clearance) from the optical fiber 112 in a plane which is orthogonal to the longitudinal direction of the optical fiber 112. Since a beam shape of a laser light becomes elliptic usually, it is preferable that the clearance be equal to or greater than 5 μm and equal to or less than 500 μm in the major axis direction of an ellipse.

As described above, herein the light L3 propagating in the cladding portion 112d is produced in the cladding portion 112d.

In the protrusion portion 112b, the light L3 is confined in the cladding portion 112d of the optical fiber 112 by the refractive index difference of the cladding portion 112d relative to air thereoutside and propagates in the cladding portion 112d of the optical fiber 112.

Then, the light L3 reaches an interface between the cladding portion 112d and the first-fixing agent 119. Herein if the refractive index of the first-fixing agent 119 is higher than the refractive index of the cladding portion 112d, the light L3 is likely to be transmitted through this interface. Moreover, the light L3 is the most likely to be transmitted through this interface when the refractive indices of the cladding portion 112d and the first-fixing agent 119 are identical. Although the light L3 transmitted through this interface (that is, leaking from the optical fiber 112) propagates in the first-fixing agent 119, the first-fixing agent 119 is restrained from being damaged since its thickness of equal to or less than 800 µm is sufficiently thin and its optical absorption is sufficiently low. It is more preferably that the thickness of the first-fixing agent 119 be equal to or less than 5 µm.

Subsequently, the light L3 reaches an interface between the first-fixing agent 119 and the glass capillary 116. The light L3 is likely to be transmitted through this interface similarly if the refractive index of the glass capillary 116 is higher than the refractive index of the first-fixing agent 119. Moreover, the light L3 is the most likely to be transmitted through this interface when the refractive indices of the first-fixing agent 119 and the glass capillary 116 are identical. Although the light L3 transmitted through this interface propagates in the glass capillary 116, the light L3 is transmitted through the glass capillary 116 since the transmissivity, for example, equal to or greater than 90%, of the light L3 at the glass capillary 116 is sufficiently high.

Subsequently, the light L3 reaches an interface between the glass capillary 116 and the second-fixing agent 120. The light L3 is likely to be transmitted through this interface similarly if the refractive index of the second-fixing agent 120 is higher than the refractive index of the glass capillary 116. Moreover, the light L3 is the most likely to be transmitted through this interface when the refractive indices of the glass capillary 116 and the second-fixing agent 120 are identical. Although the light L3 transmitted through this interface propagates in the second-fixing agent 120, the second-fixing agent 120 is restrained from being damaged since its thickness of equal to or less than 800 µm is sufficiently thin and its optical absorption is sufficiently low. It is more preferable that the thickness of the second-fixing agent 120 be equal to or less than 5 µm.

Subsequently, the light L3 reaches the light-absorbing element 117. Then, the light L3 is absorbed by the light-absorbing element 117 having optical absorptivity, for example, equal to higher than 30%, or more preferably equal to or greater than 70% of absorptivity. Heat generated by this optical absorption is radiated from the light-absorbing element 117 to the package 101.

Figure 5:
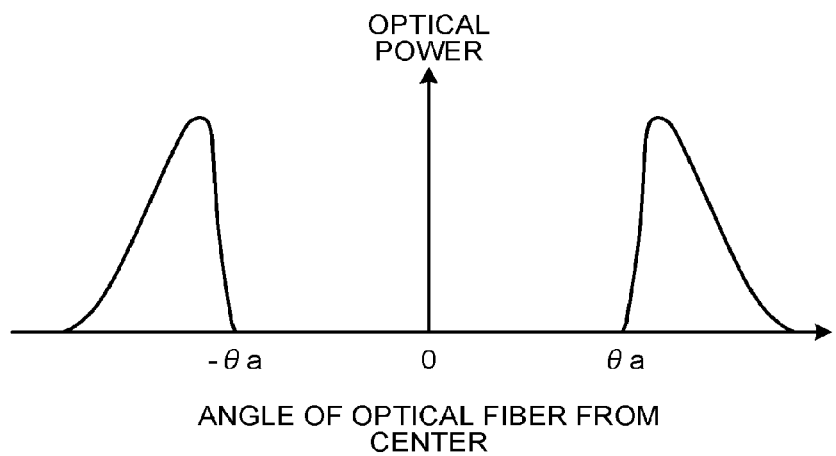
FIG. 5 is a schematic view showing a relationship between angle of a light leaking from the optical fiber relative to the center of the optical fiber and an optical power.

Herein FIG. 5 is a schematic view showing a relationship between an angle of a light leaking from an optical fiber relative to the center of the optical fiber and an optical power thereof. The horizontal axis of FIG. 5 indicates an angle of a light, propagating in the cladding portion 112d and then leaking from the optical fiber, relative to the center of the optical fiber and is an angle θ in FIG. 3. As shown in FIG. 5, the light leaking from the cladding portion 112d of the optical fiber 112 is emitted from the center of the optical fiber 112 to outside the angle θa. In this state, it is preferable that the glass capillary 116 be of a sufficient length so that a light outputted from the optical fiber 112 at an angle θa reaches the light-absorbing element 117. Moreover, it is more preferable that the glass capillary 116 be of a sufficient length so that a light reflected at, but not absorbed by, the light-absorbing element 117 reaches the light-absorbing element 117 again. For length as such, the glass capillary 116 is of a length of equal to or greater than 3 mm in the longitudinal direction of the round tube.

It is preferable that an inner diameter of the round tube of the glass capillary 116 be equal to or smaller than 0.13 mm for decreasing the amount of the first-fixing agent 119 sufficiently. It is preferable that the glass capillary 116 be of, or greater than, a certain thickness so that heat caused by optical absorption by the light-absorbing element 117 does not damage the first-fixing agent 119 and the coated portion 112a of the optical fiber 112, and it is preferable that an outer diameter of the round tube be, for example, equal to or greater than 1.8 mm.

As described above, the semiconductor laser module 100 according to the present embodiment obtains an effect below. That is, a non-coupled light is restrained from being incident to the glass capillary 116 by the first light-blocking portion 113. As a result, the first-fixing agent 119, the second-fixing agent 120, and the coated portion 112a or the like of the semiconductor laser module 100 are restrained from being damaged by the non-coupled light.

A refractive index of each member of the semiconductor laser module 100 is selected appropriately so that a light propagating in the cladding portion 112d is likely to leak from the optical fiber at each of interfaces of the cladding portion 112d to second-fixing agent 120. Therefore, since the light leaking as such is restrained from being reflected at each interface, the light leaking as such is absorbed by the light-absorbing element 117 effectively.

Moreover, since the semiconductor laser module 100 has the glass capillary 116 between the optical fiber 112 and the light-absorbing element 117, the density of the leakage light can be reduced before the leakage light from the optical fiber 112 reaches the light-absorbing element 117. Hereby an increase in temperature of the light-absorbing element 117 can be restrained.

Moreover, since the semiconductor laser module 100 includes the light-absorbing element 117 having a optical absorptivity, the reflected light at the light-absorbing element 117 is restrained from damaging the first-fixing agent 119, the second-fixing agent 120, and the coated portion 112a.

Since the first-fixing agent 119 and the second-fixing agent 120 are sufficiently thin, the semiconductor laser module 100 is restrained from being damaged by optical absorption of the first-fixing agent 119 and the second-fixing agent 120. The semiconductor laser module 100 according to the present embodiment obtains the effects described above and is a highly reliable semiconductor laser module.

Moreover, since the second light-blocking portion 118 has inclination or curvature so that a light being incident thereto is reflected in a direction leaving away from the optical fiber 112, and since the light being incident to the second light-blocking portion 118 is reflected and prevented from damaging the first-fixing agent 119 of a tapered portion of the glass capillary 116, the semiconductor laser module 100 is a highly reliable semiconductor laser module. Since it is not preferable from a safety point of view if a light being transmitted through the glass capillary 116 leaks outside the semiconductor laser module 100, the second light-blocking portion 118 prevents the light being transmitted through the glass capillary 116 from being emitted to outside the semiconductor laser module 100. For this reason, the semiconductor laser module 100 is a highly safe semiconductor laser module.

As described above, the semiconductor laser module 100 according to the present embodiment is a highly reliable and safe semiconductor laser module.

(Modified Example)

Hereafter, a modified example of the semiconductor laser module in the above-described embodiment will be explained. The semiconductor laser module according to the modified example can be configured by replacing each of the elements of the semiconductor laser module of the above-described embodiment with elements of a modified example below.

Figure 6:
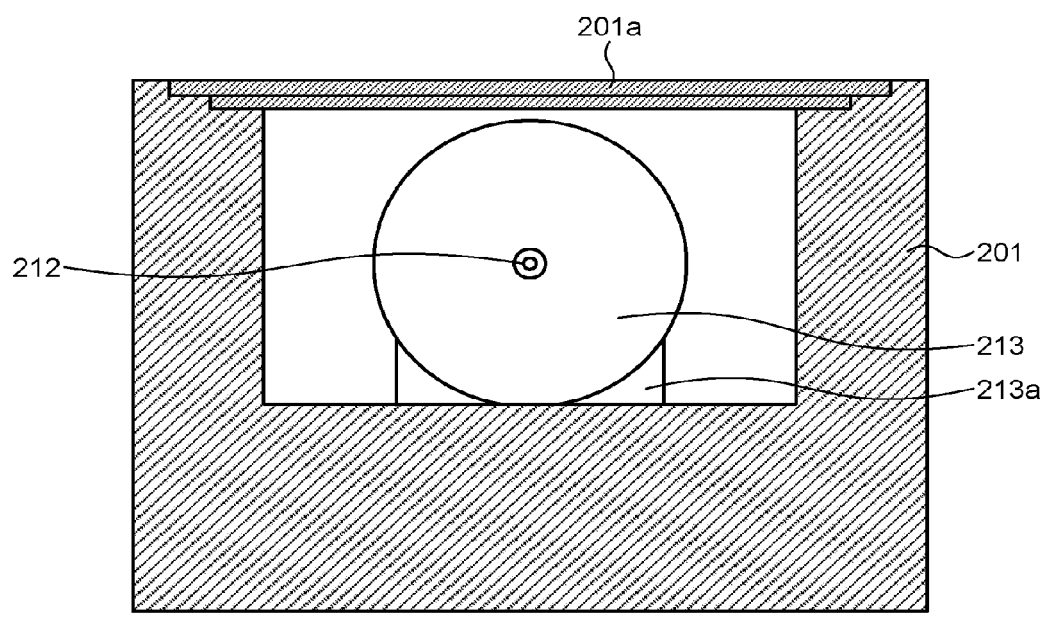
FIG. 6 is an enlarged schematic partially cutout view of a first light-blocking portion of a semiconductor laser module according to a modified example.

The first light-blocking portion is not limited to a shape shown in FIG. 4. FIG. 6 is an enlarged schematic partially cutout view of a first light-blocking portion of a semiconductor laser module according to a modified example. As shown in FIG. 6, a first light-blocking portion 213 may be a first light-blocking portion 213 which is a round disk provided with a hole through which, for example, an optical fiber 212 is inserted. The first light-blocking portion 213 is mounted on a pedestal 213a fixed on a package 201. As described above, the first light-blocking portion 213 is not limited to a specific shape as long as the first light-blocking portion 213 is capable of restraining a non-coupled light from being incident to a glass capillary.

Figure 7:
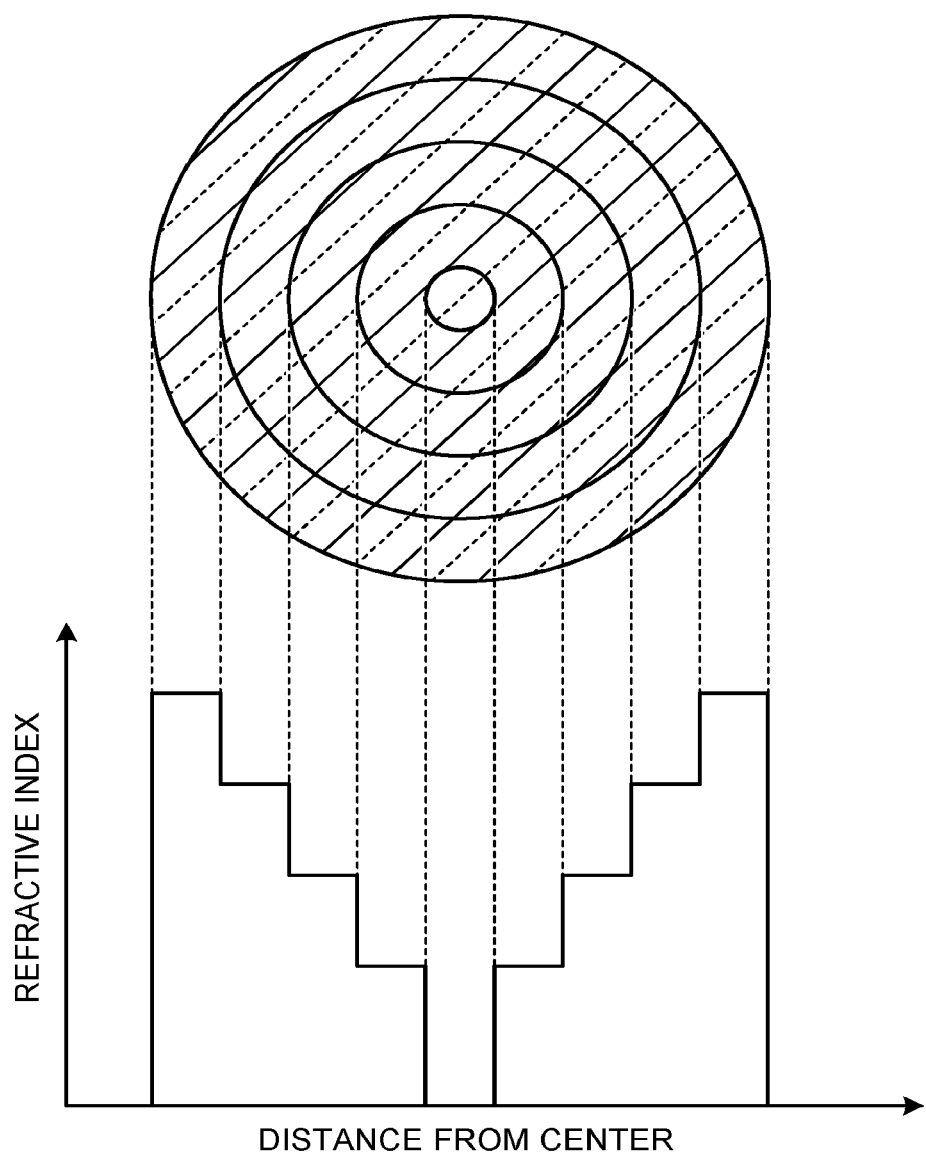
FIG. 7 is a schematic view showing refractive index of a cross section of the glass capillary orthogonal to the longitudinal direction of the optical fiber of the semiconductor laser module according to the modified example.

The glass capillary as an optical component may have a refractive index profile in a cross section which is orthogonal to the longitudinal direction of the optical fiber. FIG. 7 is a schematic view showing refractive index of a cross section orthogonal to the longitudinal direction of the optical fiber of the glass capillary of the semiconductor laser module according to the modified example. As shown in FIG. 7, the glass capillary of the modified example is made higher in its refractive index, if being more distant from its center, in the cross section orthogonal to the longitudinal direction of the optical fiber. As a result, this glass capillary is capable of causing the incident light to escape thereoutside effectively. Therefore, the glass capillary of the modified example is capable of further increasing reliability of the semiconductor laser module.

Moreover, it is preferable that the glass capillary as an optical component restrain a light emitted from the optical fiber to the glass capillary from returning to the optical fiber. FIGS. 8 to 11 are schematic cross-sectional views of the cross section orthogonal to the longitudinal direction of the optical fiber of the glass capillary of the semiconductor laser module according to the modified example.

Figure 8:
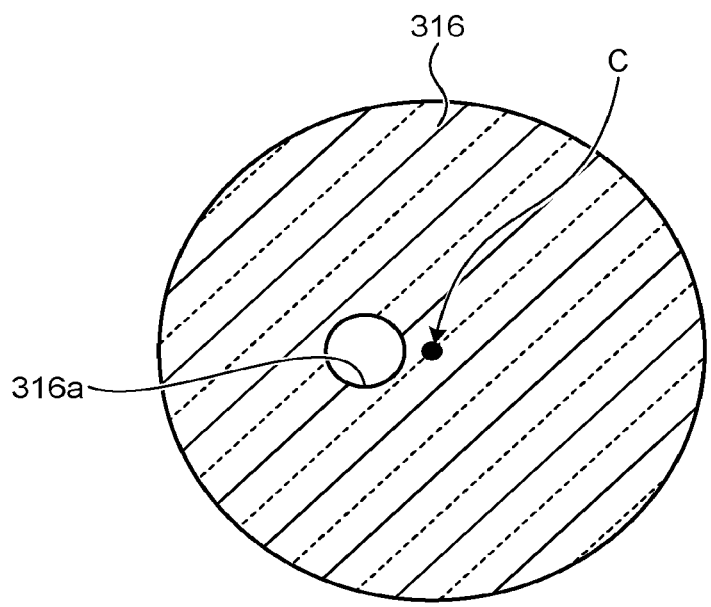
FIG. 8 is a schematic cross-sectional view of the cross section of the glass capillary orthogonal to the longitudinal direction of the optical fiber of the semiconductor laser module according to the modified example.

As shown in FIG. 8, although a glass capillary 316 of the modified example is round-shaped in the cross section orthogonal to the longitudinal direction of the optical fiber, the center of a through hole 316a is eccentric from the center C of the glass capillary 316. That is, an optical fiber is inserted through the glass capillary 316 at a position that is eccentric from the center C. As a result, the glass capillary 316 restrains a light emitted from the optical fiber to the glass capillary 316 from being reflected by the light-absorbing element and returning to the optical fiber.

Figure 9:
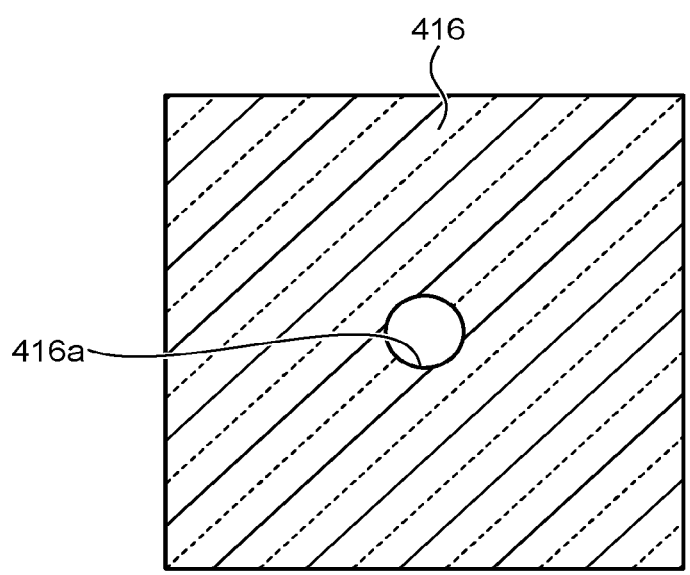
FIG. 9 is a schematic cross-sectional view of the cross section of the glass capillary orthogonal to the longitudinal direction of the optical fiber of the semiconductor laser module according to the modified example.

As shown in FIG. 9, a glass capillary 416 of a next modified example may be rectangular in the cross section orthogonal to the longitudinal direction of the optical fiber. As a result, the glass capillary 416 restrains a light emitted from the optical fiber to the glass capillary 416 from being reflected by the light-absorbing element and returning to the optical fiber. Similarly, the glass capillary may be of a polygonal shape, a flower shape, or a star shape or the like in the cross section orthogonal to the longitudinal direction of the optical fiber.

Figure 10:
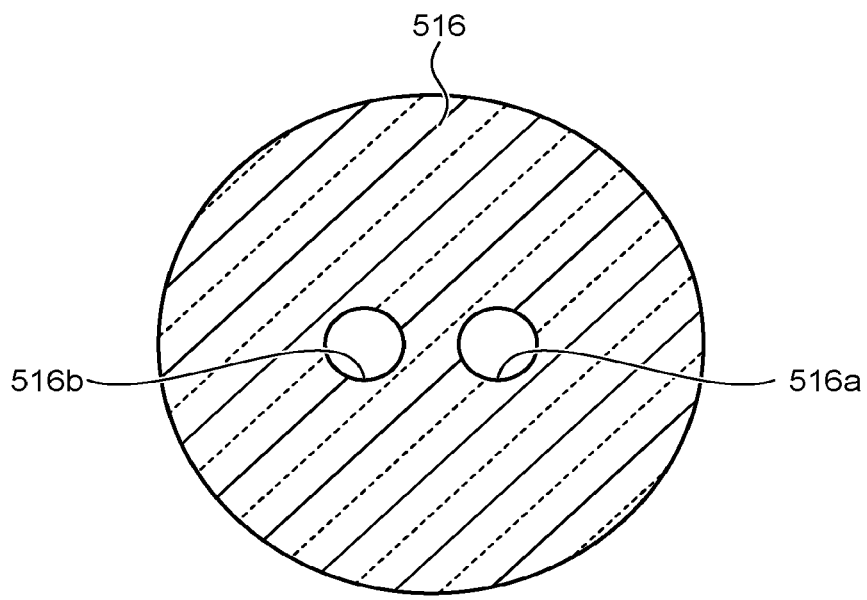
FIG. 10 is a schematic cross-sectional view of the cross section of the glass capillary orthogonal to the longitudinal direction of the optical fiber of the semiconductor laser module according to the modified example.

As shown in FIG. 10, a glass capillary 516 may be a two-core capillary provided with two through holes as a through hole 516a and a through hole 516b extending in the longitudinal direction of the optical fiber. An optical fiber is inserted through one of the through hole 516a and the through hole 516b of the glass capillary 516. Both the through hole 516a and the through hole 516b are disposed to be eccentric from the center of the glass capillary 516. As a result, in the glass capillary 516, a light emitted from the optical fiber to the glass capillary 516 is restrained from being reflected by the light-absorbing element and returning to the optical fiber.

In the glass capillaries of the modified examples described above, since the light emitted from the optical fiber to the glass capillary is restrained from returning to the optical fiber, the first-fixing agent, the second-fixing agent, and the coated portion of the optical fiber are restrained from being damaged by the light reflected by the light-absorbing element. Therefore, the glass capillaries of the modified examples are capable of increasing reliability of the semiconductor laser module.

Figure 11:
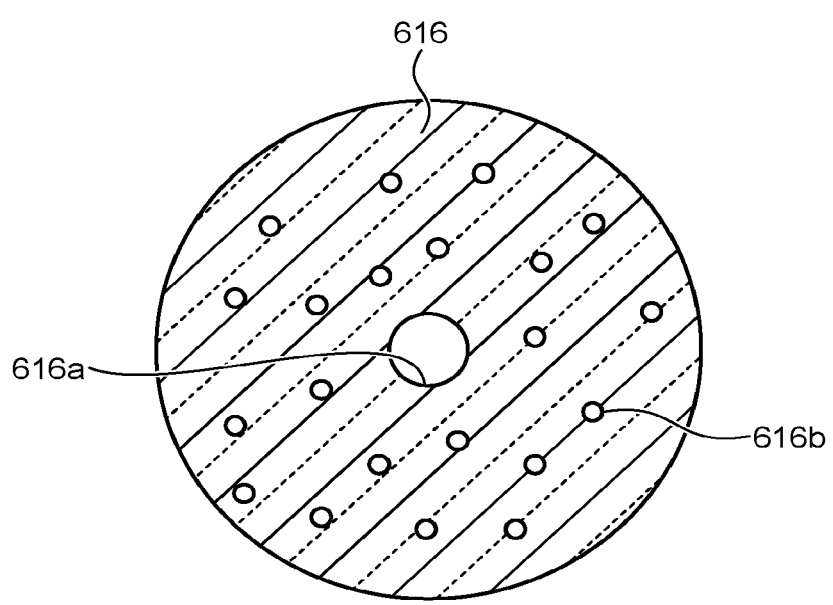
FIG. 11 is a schematic cross-sectional view of the cross section of the glass capillary orthogonal to the longitudinal direction of the optical fiber of the semiconductor laser module according to the modified example.

As shown in FIG. 11, a glass capillary 616 of another modified example may be provided with a light-scattering means as, for example, a bubble 616b. As a result, the glass capillary 616 is capable of making the light being incident from the cladding portion be scattered by the bubble 616b to be absorbed by the light-absorbing element effectively. This glass capillary restrains the first-fixing agent, the second-fixing agent, and the coated portion or the like of the optical fiber from being damaged by making the light-absorbing element absorb the light emitted from the optical fiber to the glass capillary effectively. Therefore, the glass capillaries of the modified examples are capable of increasing the reliability of the semiconductor laser module.

Figure 12:
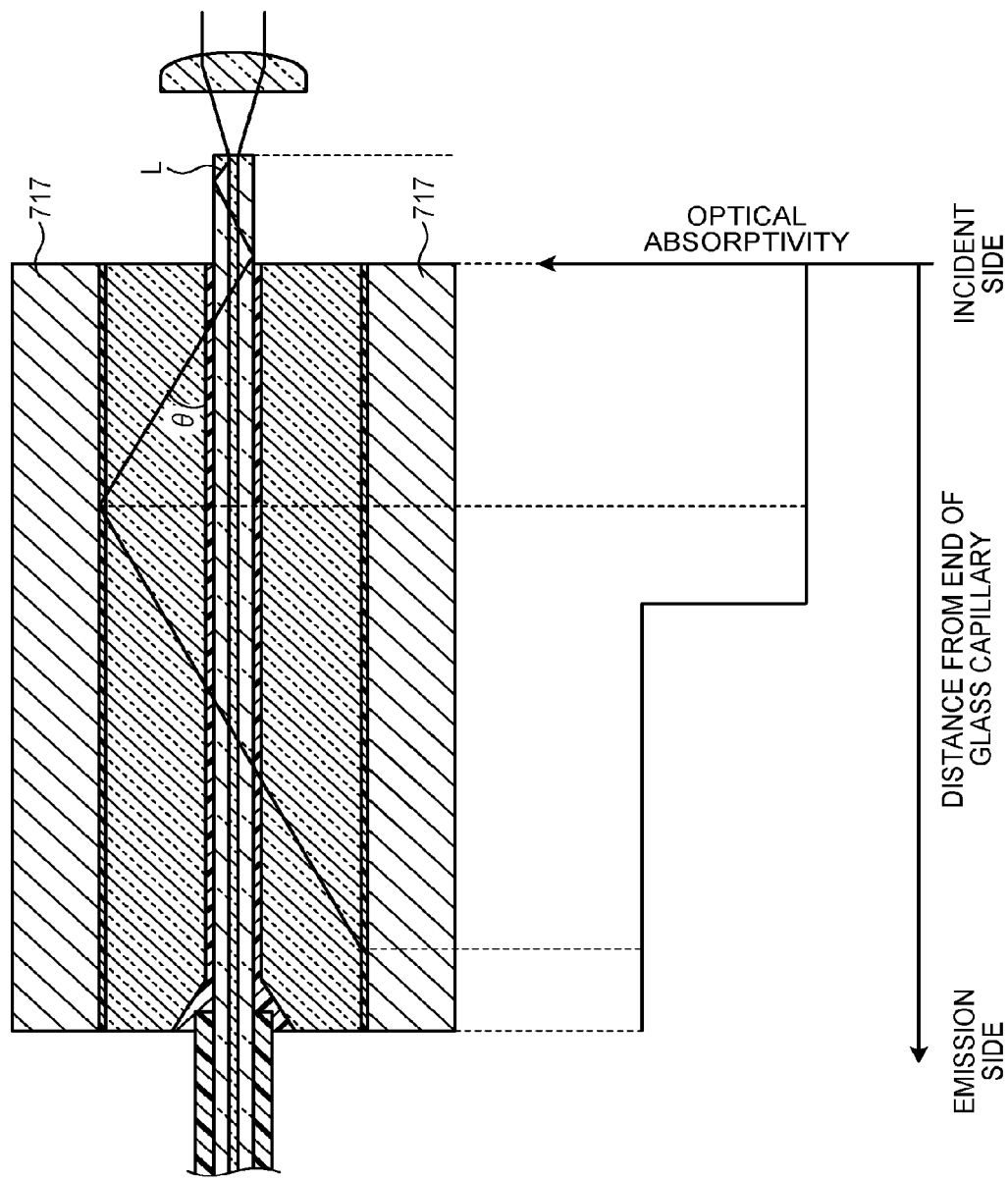
FIG. 12 is a schematic view showing a relationship between distance from an end surface, at an incident side, of the glass capillary in the longitudinal direction of the optical fiber and optical absorptivity of the light-absorbing element of the semiconductor laser module according to the modified example.

The light-absorbing element may have a profile for an optical absorptivity at a wavelength of the laser light along the longitudinal direction of the optical fiber. FIG. 12 is a schematic view showing a relationship between distance from an end surface, at an incident side, of the glass capillary in the longitudinal direction of the optical fiber and optical absorptivity of the light-absorbing element of the semiconductor laser module according to the modified example. As shown in FIG. 12, optical absorptivity of a light-absorbing element 717 according to the modified example is made higher at a side emitting a laser light than at a side into which the laser light is incident. In this state, as shown in FIG. 12, the optical absorptivity of the light-absorbing element 717 is higher at a position where a laser light L, as a light leaking from, for example, the cladding, is reflected once by the light-absorbing element 717 and is irradiated to the light-absorbing element 717 for the second time than at a position where the laser light L is irradiated to the light-absorbing element at first. This results in restraining the second-fixing agent from being damaged by heat produced by optical absorption concentrated at a side into which the laser light L is incident. Therefore, the light-absorbing element 717 of the modified example is capable of increasing the reliability of the semiconductor laser module.

As a specific example of the light-absorbing element having a profile of optical absorptivity, average surface roughness of a plane, of the light-absorbing element of the modified example, fastened to the glass capillary is made smaller at a side of the fourth lens (light-incident-side) along the longitudinal direction of the optical fiber. Herein the absorptivity of metal becomes higher if the surface roughness of the plane into which a light is incident is greater. Therefore, the optical absorptivity of this light-absorbing element is smaller at the side of the fourth lens. That is, in this light-absorbing element, the second-fixing agent is restrained from being damaged by heat produced by optical absorption concentrated at a side into which the laser light L is incident. Therefore, the light-absorbing element of the modified example is capable of increasing the reliability of the semiconductor laser module.

Figure 13:
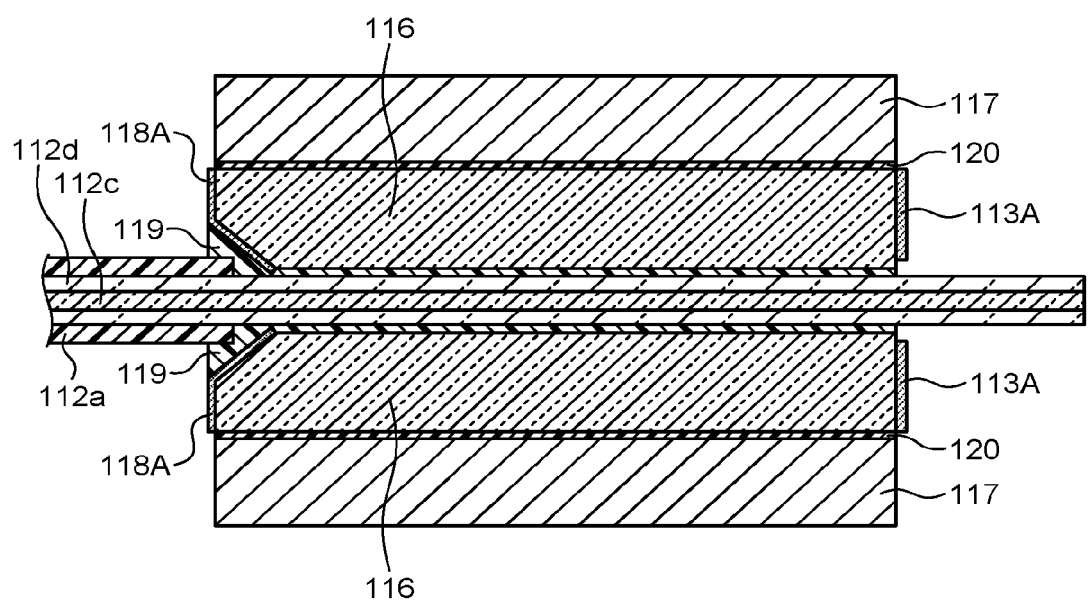
FIG. 13 is an enlarged schematic cross-sectional view of an optical fiber, a glass capillary, and a light-absorbing element of the semiconductor laser module according to the modified example.

FIG. 13 is an enlarged schematic cross-sectional view of an optical fiber, a glass capillary, and a light-absorbing element of the semiconductor laser module according to the modified example. As the first light-blocking portion and the second light-blocking portion, a first light-blocking portion 113A and a second light-blocking portion 118A shown in FIG. 13 may be provided instead of the first light-blocking portion 113 and the second light-blocking portion 118 shown in FIGS. 2 and 3. These first light-blocking portion 113A and the second light-blocking portion 118A are dielectric multi-layers formed at an end surface of the glass capillary 116. It is preferable that reflectivity of this dielectric multi-layer be equal to or greater than 90% at wavelengths of laser lights outputted by the semiconductor laser elements 104-1 to 6. It is preferable that a distance (clearance) between the first light-blocking portion 113A and the optical fiber 112 be equal to or greater than 5 μm and equal to or less than 500 μm in a major axis direction of a beam, shaped in ellipse, of the laser light. Although the second light-blocking portion 118A shown in FIG. 13 is formed from an end surface of the glass capillary 116 to a tapered portion of the through hole, the second light-blocking portion 118A may not be formed at the tapered portion alternatively.

By providing the second light-blocking portion 118A, it is possible to restrain the light, transmitted through the glass capillary 116 and emitted from the end surface, at an emitting side, of the glass capillary 116 from being emitted to outside the semiconductor laser module 100 and make the light-absorbing element 117 absorb the light.

The semiconductor laser module may be provided with various kinds of radiation structure. As a result, the semiconductor laser module is capable of restraining the second-fixing agent from being damaged by temperature increased by optical absorption of the light-absorbing element. For such radiation structures, a radiation structure being provided with a fin air-cooling an light-absorbing element or a package and a radiation structure or the like being provided with a circulation pump and cooling a light-absorbing element or a package with water or various kinds of refrigerant can be chosen.

As described above, the semiconductor laser module of the present embodiments or the modified examples is a highly reliable semiconductor laser module.

The present invention is not limited to the above-described embodiments. The present invention includes a configuration appropriately combining the above-described elements. Further effects or modification examples can be derived by an ordinary skilled person in the art easily. Therefore, further wide aspects of the present invention are not the above-described embodiments, and various modifications may be made.

As described above, the semiconductor laser module according to the present invention is suitable mainly for use in high-output semiconductor laser module.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module comprising:
   a semiconductor laser element configured to output a laser light;
   an optical fiber comprising a core portion and a cladding portion formed at an outer periphery of the core portion, the laser light being made incident into an end of the optical fiber, the optical fiber being configured to guide the laser light to outside the semiconductor laser module;
   an optical component being disposed at an outer periphery of the optical fiber and being configured to fix the optical fiber;
   a first-fixing agent configured to fasten the optical component and the optical fiber;
   a light-absorbing element being disposed at an outer periphery of the optical component and being configured to fix the optical component;
   a first light-blocking portion disposed between an end, into which the laser light is incident, of the optical fiber and the optical component, the first light-blocking portion including an aperture through which the optical fiber passes; and
   a housing configured to accommodate therein the semiconductor laser element, an end, at a side into which the laser light is incident, of the optical fiber, and the first light-blocking portion,
   wherein the optical component has an optical transmittance at a wavelength of the laser light, and the light-absorbing element has an optical absorptivity at a wavelength of the laser light.

2. The semiconductor laser module according to claim 1, wherein a refractive index of the first-fixing agent is equal to or higher than a refractive index of the cladding portion.

3. The semiconductor laser module according to claim 1, further comprising a second-fixing agent configured to fasten the optical component and the light-absorbing element,
   wherein the first-fixing agent and the second-fixing agent are made of a same material, and the refractive index of the first-fixing agent and a refractive index of the second-fixing agent are approximately equal to a refractive index of the optical component and higher than the refractive index of the cladding portion.

4. The semiconductor laser module according to claim 1, wherein the optical fiber includes a protrusion portion protruding from the optical component at a side of the end into which the laser light is incident.

5. The semiconductor laser module according to claim 4, wherein the first light-blocking portion is disposed at an outer periphery of the protrusion portion to be separated from the optical fiber.

6. The semiconductor laser module according to claim 1, wherein the first light-blocking portion has at least one of a metal component containing Cu, Ni, stainless steel, or Fe;
   a member provided with a surface-plated layer containing Ni, Cr, or Ti; and
   a member provided with a dielectric multi-layer.

7. The semiconductor laser module according to claim 1, wherein the light-absorbing element is connected to the housing via a good heat conductor.

8. The semiconductor laser module according to claim 7, wherein a thermal conductivity of the good heat conductor is equal to or greater than 0.5 W/mK.

9. The semiconductor laser module according to claim 1, wherein the light-absorbing element has at least one of a metal component containing Cu, Ni, stainless steel, or Fe;
   a member provided with a metal containing Ni, Cr, and Ti or a surface-plated layer containing C;
   a ceramics component containing AlN or $Al_2O_3$; and
   a member provided with a ceramics layer covering a surface containing AlN or $Al_2O_3$.

10. The semiconductor laser module according to claim 1, further comprising a second light-blocking portion being disposed at an end, from which the laser light is emitted, of the optical fiber and being configured to restrain the laser light from being emitted from the optical component.

11. The semiconductor laser module according to claim 10, wherein the second light-blocking portion has at least one of a metal component containing Cu, Ni, stainless steel, or Fe; and
a member provided with a dielectric multi-layer.

12. The semiconductor laser module according to claim 10, wherein a plane, at a side of the optical component, of the second light-blocking portion has inclination or curvature so that a light being incident into the plane is reflected in a direction leaving away from the optical fiber.

13. The semiconductor laser module according to claim 1, wherein the optical component is a tube-shaped glass capillary.

14. The semiconductor laser module according to claim 13, wherein a length in a longitudinal direction of a tube of the optical component is equal to or greater than 3 mm, an inner diameter of the tube is equal to or smaller than 0.13 mm, and an outer diameter of the tube is equal to or greater than 1.8 mm.

15. The semiconductor laser module according to claim 1, wherein an optical absorptivity, at a wavelength of the laser light, of the light-absorbing element is made lower along a longitudinal direction of the optical fiber toward the side of the end of the optical fiber, the laser light being incident into the end.

16. The semiconductor laser module according to claim 1, wherein an average surface roughness of a plane, fastened to the optical component, of the light-absorbing element is made lower along the longitudinal direction of the optical fiber toward the side of the end of the optical fiber, the laser light being incident into the end.

17. The semiconductor laser module according claim 1, wherein the optical fiber is inserted through the optical component at a position that is eccentric from a center of the optical component in a plane orthogonal to the longitudinal direction of the optical fiber.

18. The semiconductor laser module according to claim 1, wherein a shape, in a cross section orthogonal to the longitudinal direction of the optical fiber, of the optical component is of a polygonal shape, a flower shape, or a star shape.

19. The semiconductor laser module according to claim 1, wherein the optical component is a two-core capillary having two through holes extending in the longitudinal direction of the optical fiber, and the optical fiber is inserted through any one of the through holes.

20. The semiconductor laser module according to claim 1, wherein the optical component has a light-scatterer scattering the laser light.

21. the semiconductor laser module according to claim 20, wherein the light-scatterer is a bubble.

* * * * *